United States Patent
Park et al.

(10) Patent No.: US 7,786,551 B2
(45) Date of Patent: Aug. 31, 2010

(54) INTEGRATED CIRCUIT SYSTEM WITH WAFER TRIMMING

(75) Inventors: Seung Wook Park, Seoul (KR); Taewoo Lee, Yong Jun dong (KR); Sung Yoon Lee, In-Chon Si (KR)

(73) Assignee: STATS ChipPAC Ltd., Singapore (SG)

( * ) Notice: Subject to any disclaimer, the term of this patent is extended or adjusted under 35 U.S.C. 154(b) by 103 days.

(21) Appl. No.: 11/532,455

(22) Filed: Sep. 15, 2006

(65) Prior Publication Data

US 2007/0108557 A1    May 17, 2007

Related U.S. Application Data

(60) Provisional application No. 60/596,336, filed on Sep. 16, 2005.

(51) Int. Cl.
*H01L 23/544* (2006.01)
(52) U.S. Cl. ...................... 257/620; 438/462
(58) Field of Classification Search .................. 257/620
See application file for complete search history.

(56) References Cited

U.S. PATENT DOCUMENTS

| | | | | |
|---|---|---|---|---|
| 5,185,965 | A | * | 2/1993 | Ozaki ............................ 451/5 |
| 5,693,182 | A | | 12/1997 | Mathuni |
| 6,797,625 | B2 | | 9/2004 | Kim et al. |
| 6,958,298 | B2 | | 10/2005 | Murayama |
| 2004/0097084 | A1 | | 5/2004 | Fukuda et al. |
| 2004/0129940 | A1 | * | 7/2004 | Iwase et al. ................... 257/48 |
| 2005/0023647 | A1 | * | 2/2005 | Nemoto et al. ............... 257/620 |

FOREIGN PATENT DOCUMENTS

| JP | 2003-273053 A | 9/2003 |
|---|---|---|
| JP | 2004-207459 A | 7/2004 |

OTHER PUBLICATIONS

Van Zant, Peter. Microchip Fabrication, 5th ed., 2004, McGraw-Hill, p. 68.*

* cited by examiner

*Primary Examiner*—Thao X Le
*Assistant Examiner*—Tanika Warrior
(74) *Attorney, Agent, or Firm*—Mikio Ishimaru

(57) ABSTRACT

An integrated circuit system includes an integrated circuit wafer, forming a trimmed edge on the integrated circuit wafer, and applying a thinning process on the integrated circuit wafer with the trimmed edge.

17 Claims, 3 Drawing Sheets

INTEGRATED CIRCUIT SYSTEM WITH WAFER TRIMMING

CROSS-REFERENCES TO RELATED APPLICATION(S)

This application claims the benefit of U.S. Provisional Patent Application Ser. No. 60/596,336 filed Sep. 16, 2005, and the subject matter thereof is hereby incorporated herein by reference thereto.

TECHNICAL FIELD

The present invention relates generally to integrated circuit systems, and more particularly to a system for integrated circuit package with bonding.

BACKGROUND ART

Increasing demand across virtually all aspects of modern life drives integrated circuit technology. Demands for smaller, cheaper, faster, include packaging of integrated circuits. In general, an electronic package is defined as the housing and interconnection of integrated circuits, also referred to as 'semiconductor device', 'chip' or 'die', to form an electronic system. The package should provide a structure physically supporting the chip and protecting the chip from the environment, a means for removing heat generated by the chips or system, and/or electrical connections to provide signal and power access to and from the chip.

Faster, more reliable, and higher-density circuits, produced at lower cost, are the goals for the entire integrated circuit (IC) packaging industry to produce smaller devices for cellphones, video cameras, portable music players, etc. The goals of packaging IC for the future will be met by reducing the number of internal interconnections and increasing the density of chips. Various techniques, such as, flip chip, gall grid array (BGA), chip on board (COB), and multi-chip modules (MCM), have been developed to meet the continued demands for improving system performance and hardware capabilities, while the space in which to provide these improved hardware capabilities continues to decrease.

In the production process of a semiconductor device, individual semiconductor chips are manufactured by forming a circuit such as IC, LSI or the like in a large number of areas arranged in a lattice pattern on the front surface of a substantially disk-like semiconductor wafer having an orientation notch in the edge.

As lighter and smaller electronic devices come into demand for smaller cellphones, computers, and other personal devices, the lattice pattern must be even smaller and the ICs must be even thinner than the thickness of the semiconductor wafer.

To produce even thinner ICs, a process for backgrinding the semiconductor wafer has been developed in which the semiconductor wafer is flipped over for the backside to be ground using a grinding wheel.

Unfortunately, as the semiconductor wafer is ground thinner, edge chipping occurs at the outside edge of the semiconductor wafer and this sometimes results in cracking of individual ICs around the outside periphery and even inside the outer periphery of the semiconductor wafer. This means that the yield is reduced as valuable ICs are damaged.

Across virtually all applications, there continues to be growing demand for increasing capacity and increasing performance of integrated circuits. The seemingly endless restrictions and requirements are no more visible than with products in our daily lives. Smaller and denser integrated circuits are expected in many portable electronic products as well as in many larger electronic systems. As the demand grows for smaller electronic products with more features, manufacturers are seeking ways to include more functions within the same or smaller product form factors.

Thus, a need still remains for an integrated circuit system to provide improved thinning as well as manufacturing yield. In view of the increasing demand for improved integrated circuits and particularly smaller products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit wafer, forming a trimmed edge on the integrated circuit wafer, and applying a thinning process on the integrated circuit wafer with the trimmed edge.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
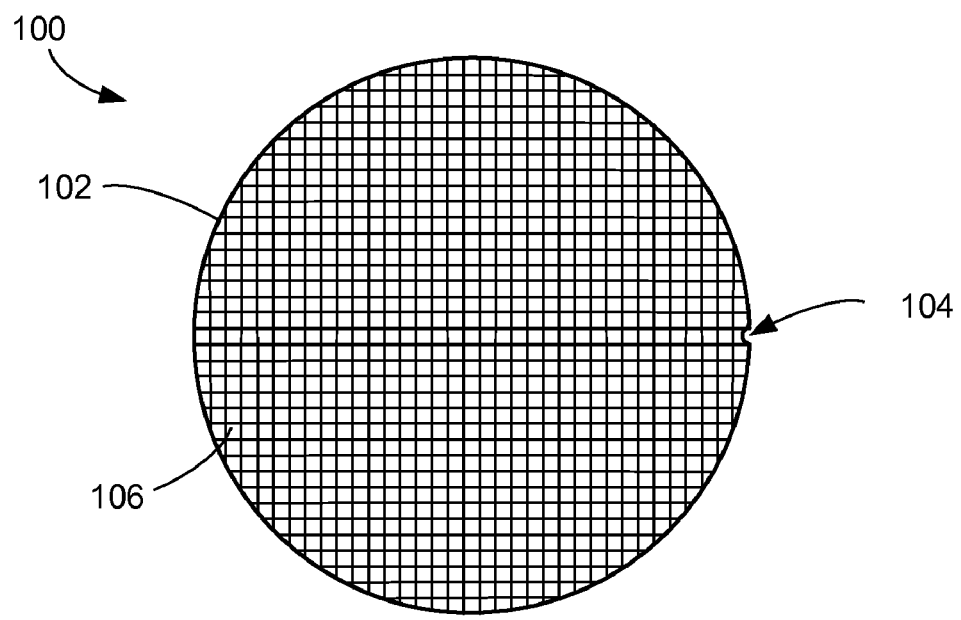
FIG. 1 is a top view of an integrated circuit system with wafer trimming in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the cartridge, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure.

Referring now to FIG. 1, therein is shown a top view of an integrated circuit system 100 with wafer trimming in an embodiment of the present invention. The integrated circuit system 100 includes an integrated circuit wafer 102 having a wafer notch 104 and an integrated circuit die 106. The wafer notch 104 extends through the full depth of the wafer. The wafer notch 104 can provide a reference point for orientation of the integrated circuit die 106 on the integrated circuit wafer 102. Many of the integrated circuit die 106 can be processed on one of the integrated circuit wafer 102. The integrated circuit die 106 near the perimeter of the integrated circuit wafer 102 can be damaged during further processing. The integrated circuit system 100 substantially eliminates wafer edge area stress during back grinding and polishing without tape support.

It has been discovered that the present invention eliminates the integrated circuit die 106 damaged near the perimeter of the integrated circuit wafer 102.

Figure 2:
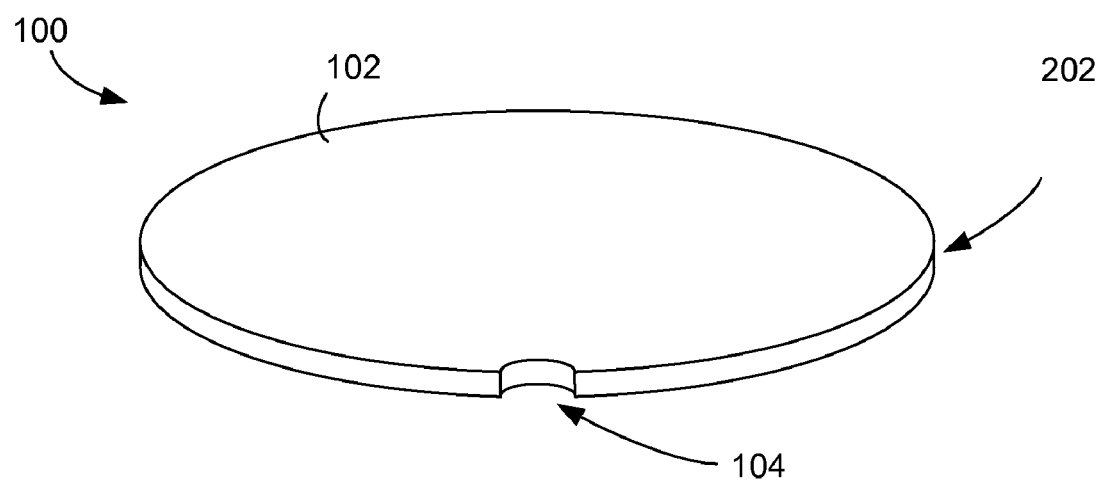
FIG. 2 is an isometric view of the integrated circuit system.

Referring now to FIG. 2, therein is shown an isometric view of the integrated circuit system 100. The integrated circuit system 100 includes the integrated circuit wafer 102 including the wafer notch 104. A trimming process provides a substantially smooth and consistent edge and surface near a trimmed edge 202. The trimmed edge 202 is isolated from a region of the integrated circuit wafer 102 utilized for tape cutting. The trimming process substantially eliminates sharp edges that have a big risk of wafer cracking and edge chipping as well as wafer edge area damage by blade touch during tape cut.

It has been discovered that edges broken by tape cutting blades can be substantially eliminated.

Figure 3:
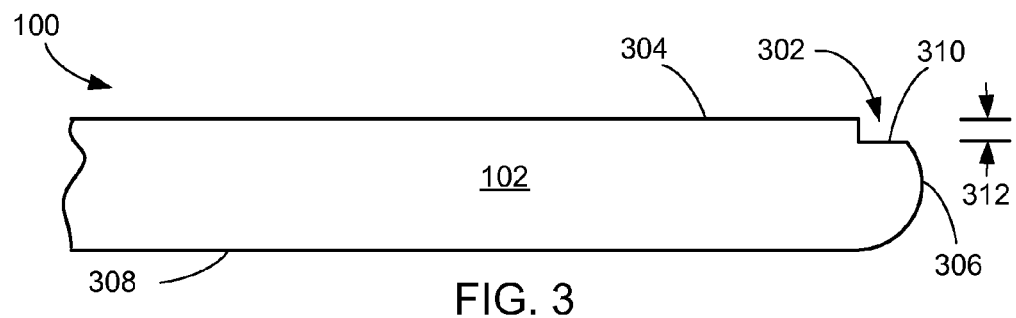
FIG. 3 is the integrated circuit system in a wafer preparation phase.

Referring now to FIG. 3, therein is shown the integrated circuit system 100 in a wafer preparation phase. The integrated circuit system 100 includes the integrated circuit wafer 102 with an inner cut 302 near a wafer active surface 304 and near a wafer edge 306. The inner cut 302 has been formed by an edge trimming process providing a recessed surface 310 at a predetermined dimension 312, such as the final thickness of the wafer plus a predetermined additional thickness. The wafer edge 306 characterized by thinning the integrated circuit wafer 102 having the inner cut 302 has improved quality with reduced chipping, cracking, lamination damage, and sharp edges. A wafer backside 308 provides a surface of the integrated circuit wafer 102 for thinning processes, such as backgrinding and polishing.

It has been discovered that the present invention substantially eliminates wafer edge chipping due to lamination quality.

Figure 4:
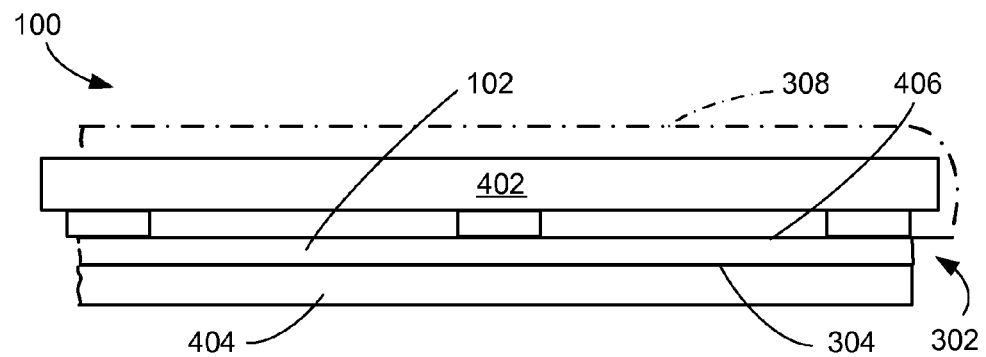
FIG. 4 is the integrated circuit system in a wafer backgrinding phase.

Referring now to FIG. 4, therein is shown the integrated circuit system 100 in a wafer backgrinding phase. Thickness of the integrated circuit wafer 102 can be reduced by a removal apparatus 402, such as a grinding device or a backgrinding device. A layer 404, such as a backgrind tape, is attached to the wafer active surface 304. The layer 404 can protect the wafer active surface 304 including circuitry (not shown). A portion of the wafer backside 308 can be removed by the removal apparatus 402 to form an edge trimmed wafer backside 406. The edge trimming, particularly with an angle laminator, substantially eliminates seepage.

It has been discovered that wafer edge damage, wafer edge cracking by tape burr seepage, and wafer edge stress can be substantially eliminated providing the wafer active surface 304 substantially smooth.

Figure 5:
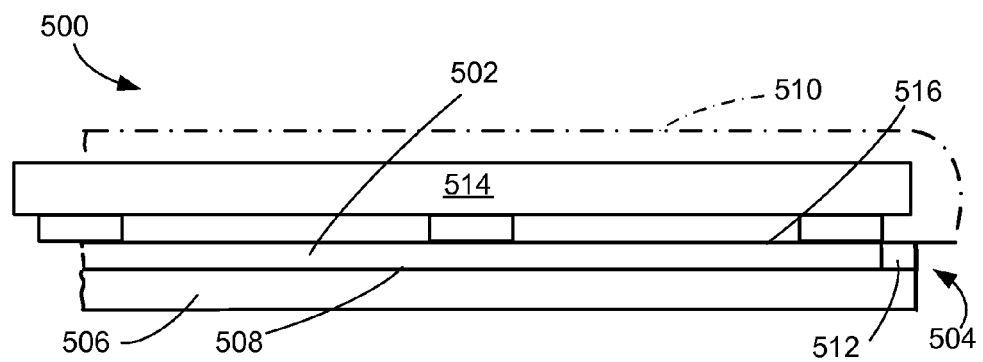
FIG. 5 is an integrated circuit system in an alternative embodiment of the present invention in a wafer backgrinding phase.

Referring now to FIG. 5, therein is shown an integrated circuit system 500 in an alternative embodiment of the present invention in a wafer backgrinding phase. The integrated circuit system 500 includes an integrated circuit wafer 502 with an inner cut 504. A layer 506, such as a backgrind tape an angle cut tape or a large cut tape, is attached to a wafer active surface 508. The layer 506 can protect the wafer active surface 508 including circuitry (not shown) on a side opposite a wafer backside 510. A fill material 512, such as an epoxy, can be applied to the inner cut 504. The layer 506 can be laminated over the inner cut 504 and the fill material 512. Thickness of the integrated circuit wafer 502 can be reduced by a removal apparatus 514, such as a grinding device or a backgrinding device.

A portion of the wafer backside 510 can be removed by the removal apparatus 514 to form an edge trimmed wafer backside 516. The wafer active surface 508 characterized by thinning the integrated circuit wafer 502 having the fill material 512 has improved quality with reduced chipping, cracking, lamination damage, and sharp edges.

It has been discovered that edge cracking and chip damage can be substantially eliminated providing the wafer active surface 508 substantially smooth.

Figure 6:
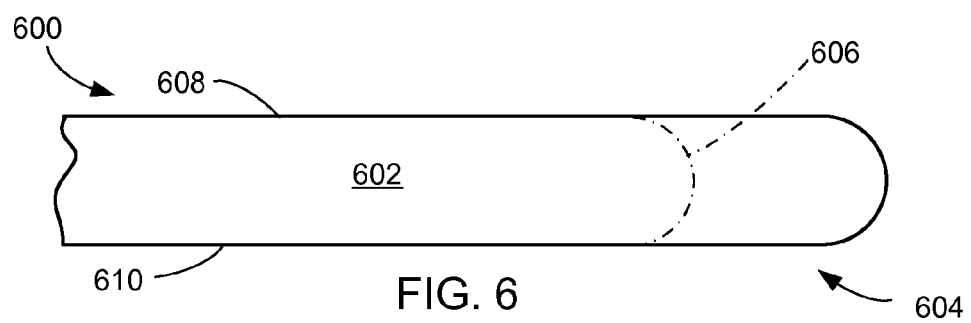
FIG. 6 is a side view of an integrated circuit system in another alternative embodiment.

Referring now to FIG. 6, therein is shown a side view of an integrated circuit system 600 in another alternative embodiment. The integrated circuit system 600 includes an integrated circuit wafer 602 having a wafer notch 604. The wafer notch 604 is formed by a recessed edge 606 of the integrated circuit wafer 602 that can extend to a wafer active surface 608 and a wafer backside 610. The wafer notch 604 can provide orientation during processing of the integrated circuit wafer 602 including the integrated circuit die 106 of FIG. 1.

It has been discovered that the disclosed structure substantially eliminates damage to the wafer notch 604.

Figure 7:
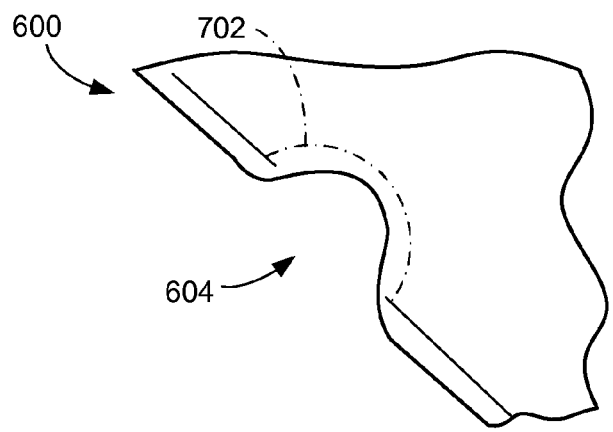
FIG. 7 is an isometric view of the integrated circuit system.

Referring now to FIG. 7, therein is shown an isometric view of the integrated circuit system 600. Although, edge trimming processes utilizing a blade do not apply near the wafer notch 604, the wafer notch 604 and adjacent region can be susceptible to higher stresses during fabrication. A notch region 702 near the wafer notch 604 can have more risk of damage than other regions of the integrated circuit wafer 602.

A notch trimming process, such as a laser process or a micro water-jet process provides trimming in the notch region 702 near the wafer notch 604. The wafer notch 604 characterized by thinning the notch region 702 with the notch trimming process has improved quality with reduced chipping, cracking, lamination damage, and sharp edges. Metal layers (not shown) or films (not shown), such as polyimide, are not damaged by the notch trimming process, providing edge trimming quality.

It has been discovered that the disclosed structure is compatible with volume manufacturing methods and devices.

Figure 8:
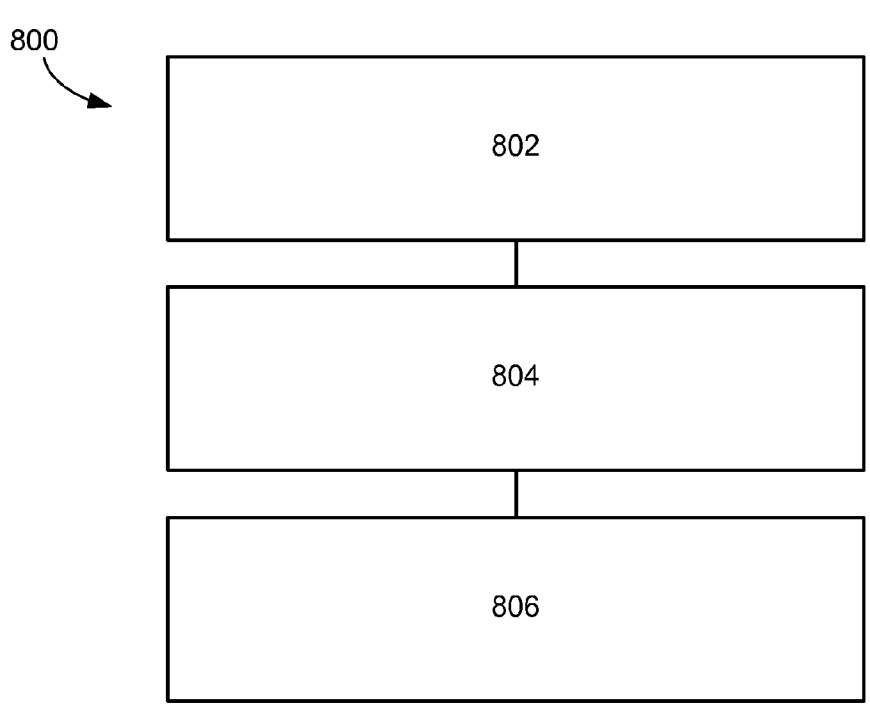
FIG. 8 is a flow chart of an integrated circuit system for manufacturing the integrated circuit system in an embodiment of the present invention.

Referring now to FIG. 8, therein is shown a flow chart of an integrated circuit system 800 for manufacturing the integrated circuit system 100 in an embodiment of the present invention. The system 800 includes providing an integrated circuit wafer in a block 802; forming a trimmed edge on the integrated circuit wafer in a block 804; and applying a thinning process on the integrated circuit wafer with the trimmed edge in a block 806.

In greater detail, a system 800 (FIG. 8) to fabricate the integrated circuit system 100, in an embodiment of the present invention, is performed as follows:

1. Providing an integrated circuit wafer having a wafer active surface and a wafer backside. (FIG. 1)
2. Forming a trimmed edge on the wafer active surface. (FIG. 2)
3. Applying a thinning process on the wafer backside adjacent to the trimmed edge. (FIG. 4)

It has been discovered that the present invention thus has numerous aspects.

An aspect is that the present invention provides trimming of the wafer edge. The wafer edge is trimmed to a predetermined dimension that can include the final thickness of the integrated circuit wafer and an additional thickness.

Another aspect is that the present invention provides trimming of the wafer notch. Blade edge trimming does not apply to the wafer notch. The wafer notch can be trimmed using a notch trimming process such as a laser process or a micro water-jet process.

Yet another aspect is that the present invention provides a fill material. The fill material provides structural integrity to the integrated circuit wafer with a trimmed edge during processing such as backgrinding and polishing.

It has been discovered that the disclosed structure eliminates sharp edges that have a big risk of wafer cracking and edge chipping. The trimming process of the present invention provides smooth and consistent edges.

It has also been discovered that the disclosed structure eliminates wafer edge lamination issues. The smooth and consistent edges provided by the trimming process of the present invention prevent layer separation.

Another discovery is that the disclosed structure eliminates wafer edge chipping due to lamination quality. The lack of layer separation by the trimming process of the present invention prevents chipping at the wafer edge.

Yet another discovery is that the disclosed structure eliminates wafer edge area damage by blade touch during tape cut. The trimming process and the fill material of the present invention provide isolation of the tape from the wafer edge.

Yet another discovery is that the disclosed structure eliminates wafer edge cracking by tape burr seepage during backgrinding. The isolation of the tape from the wafer edge also provides isolation of the surface of the wafer for backgrinding and the tape.

Yet another discovery is that the disclosed structure eliminates wafer edge area stress without tape support during backgrinding and polishing. The trimming process isolates the surface of the wafer for backgrinding and polishing from the wafer edge.

Yet another discovery of the disclosed structure is elimination of damage to the wafer notch. The notch trimming process of the present invention provides a controlled force and area for trimming the wafer notch and adjacent region.

Yet another discovery of the disclosed structure is compatibility with volume manufacturing methods and devices. The trimming process of the present invention utilizes methods and devices capable of high volume production.

Yet another discovery of the disclosed structure is improved manufacturability and yield of integrated circuit die. The elimination of damage to the integrated circuit wafer as well as utilization of volume methods and devices provides cost effective manufacturing and high yield.

These and other valuable aspects of the present invention consequently further the state of the technology to at least the next level.

Thus, it has been discovered that the integrated circuit system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacturing an integrated circuit system comprising:
providing an integrated circuit wafer;
providing a full depth wafer notch recessed into an edge of the integrated circuit wafer; forming a first trimmed edge on the integrated circuit wafer; wherein forming the first trimmed edge on the integrated circuit wafer includes forming an inner cut on a wafer active surface;
forming a second trimmed edge on the wafer notch; and
applying a thinning process on the integrated circuit wafer.

2. The method as claimed in claim 1 wherein forming the first trimmed edge on the integrated circuit wafer includes applying a fill material.

3. The method as claimed in claim 1 wherein applying the thinning process includes backgrinding a wafer backside.

4. The method as claimed in claim 1 wherein applying the thinning process includes thinning the wafer notch.

5. A method of manufacturing an integrated circuit system comprising:
providing an integrated circuit wafer having a wafer active surface and a wafer backside; providing a full depth wafer notch recessed into an edge of the integrated circuit wafer; forming a first trimmed edge using a first process on the wafer active surface; wherein forming the first trimmed edge on the integrated circuit wafer includes forming an inner cut on the wafer active surface near a wafer edge;
forming a second trimmed edge using a different second process on the wafer notch; and applying a thinning process on the wafer backside.

6. The method system as claimed in claim 5 wherein forming the first trimmed edge on the integrated circuit wafer includes a fill material over an inner cut on the wafer active surface.

7. The method system as claimed in claim 5 wherein applying the thinning process includes backgrinding a wafer backside to form an edge trimmed wafer backside.

8. The method system as claimed in claim 5 wherein applying the thinning process includes applying a notch thinning process to the wafer notch.

9. An integrated circuit system comprising:
an integrated circuit wafer having a full depth wafer notch recessed into an edge thereof, the integrated circuit wafer having a first trimmed edge around the perimeter thereof and a second trimmed edge in the wafer notch, wherein the first trimmed edge on the integrated circuit wafer includes an inner cut on a wafer active surface, the integrated circuit wafer characterized by a thinning of the integrated circuit wafer.

10. The system as claimed in claim 9 wherein the first trimmed edge on the integrated circuit wafer includes the first trimmed edge characterized by thinning the integrated circuit wafer having a fill material.

11. The system as claimed in claim 9 wherein the integrated circuit wafer includes an edge trimmed wafer backside characterized by thinning the integrated circuit wafer having an inner cut.

12. The system as claimed in claim 9 wherein the integrated circuit wafer includes the wafer notch characterized by thinning the notch region with a notch trimming process.

13. The system as claimed in claim 9 wherein:
the integrated circuit wafer has a wafer backside back ground to a predetermined thickness; and
the first trimmed edge on a wafer active surface.

14. The system as claimed in claim 13 wherein the first trimmed edge on the integrated circuit wafer includes the inner cut on the wafer active surface near a wafer edge.

15. The system as claimed in claim 13 wherein the first trimmed edge on the integrated circuit wafer includes the first trimmed edge characterized by thinning the integrated circuit wafer having a fill material on the wafer active surface.

16. The system as claimed in claim 13 wherein the integrated circuit wafer includes an edge trimmed wafer backside characterized by thinning the integrated circuit wafer having an inner cut on the wafer active surface.

17. The system as claimed in claim 13 wherein the integrated circuit wafer includes the wafer notch characterized by thinning the notch region with a laser process or a micro water-jet process.

* * * * *

UNITED STATES PATENT AND TRADEMARK OFFICE
CERTIFICATE OF CORRECTION

PATENT NO.       : 7,786,551 B2                                      Page 1 of 1
APPLICATION NO.  : 11/532455
DATED            : August 31, 2010
INVENTOR(S)      : Park et al.

It is certified that error appears in the above-identified patent and that said Letters Patent is hereby corrected as shown below:

<u>Column 6:</u>

Claim 6, line 57, delete "method system" and insert therefor --method--

Claim 7, line 61, delete "method system" and insert therefor --method--

Claim 8, line 64, delete "method system" and insert therefor --method--

Signed and Sealed this
Fourth Day of January, 2011

David J. Kappos
*Director of the United States Patent and Trademark Office*